United States Patent [19]

Toure et al.

[11] Patent Number: 5,443,688

[45] Date of Patent: Aug. 22, 1995

[54] METHOD OF MANUFACTURING A FERROELECTRIC DEVICE USING A PLASMA ETCHING PROCESS

[75] Inventors: Abron S. Toure, Stoughton; Steven R. Collins, Lexington, both of Mass.; Bruce W. LeBlanc, Manchester, N.H.

[73] Assignee: Raytheon Company, Lexington, Mass.

[21] Appl. No.: 161,280

[22] Filed: Dec. 2, 1993

[51] Int. Cl.$^6$ .......................... B44C 1/22; H01L 21/70
[52] U.S. Cl. ........................... 216/13; 156/646; 156/659.1; 437/52; 437/60; 437/919; 437/228; 216/46; 216/67; 216/48
[58] Field of Search ............ 156/643, 646, 652, 659.1; 257/295; 365/145; 437/919, 52

[56] References Cited

U.S. PATENT DOCUMENTS

| | | | |
|---|---|---|---|
| 4,760,437 | 7/1988 | Denkar et al. | 257/62 |
| 4,946,240 | 8/1990 | Yamamoto et al. | 350/96.19 |
| 5,116,643 | 5/1992 | Miller et al. | 427/126.3 |
| 5,122,923 | 6/1993 | Matsuhara | 361/321 |
| 5,229,309 | 7/1993 | Kato | 437/43 |
| 5,254,217 | 10/1993 | Mantar | 156/656 |
| 5,271,797 | 12/1993 | Kanisawa | 156/643 |
| 5,275,695 | 1/1994 | Chang | 156/661.1 |
| 5,292,445 | 3/1994 | Fjare et al. | 156/668 |
| 5,310,990 | 5/1994 | Russell et al. | 219/121.69 |
| 5,350,705 | 9/1994 | Brassington et al. | 437/52 |

FOREIGN PATENT DOCUMENTS

494313A1 2/1992 European Pat. Off. .

OTHER PUBLICATIONS

Poor et al., Measurement of etch rate and film stoichiometry variations during plasma etching of PLZT thin film, J. Appl. Phys. 70(6) Sep. 15, 1991 pp. 3385–3387.
Title et al. Reactive ion beam etching of PLZT electrooptic substrates with repeated self-aligned Masking applied optics/vol. 25, No. 9, May 1st 1986.

*Primary Examiner*—Olik Chaudhuri
*Assistant Examiner*—H. Jey Tsai
*Attorney, Agent, or Firm*—Donald F. Mofford

[57] ABSTRACT

A method of patterning a film of PZT material comprises the steps of providing a mask over a selected surface portion of the PZT material; and, plasma etching unmasked portions of the thin film material. The method includes the steps of: introducing a gas mixture of halogenated gases into a chamber; ionizing the gas mixture into a plasma in the chamber by imposition of an electric field across the introduced gaseous mixture, chemically reacting the ionized gaseous mixture, chemically reacting the unmasked portions of the lead zirconate titanate thin film material to selectively remove such exposed portion of the thin film material. The gas mixture is a mixture of a chloride and a compound of fluorine. Preferably the compound of fluorine is a halocarbon or fluorocarbon. In particular, the fluorocarbon is a trifluoromethane, $CHF_3$, and the chloride is boron trichloride $BCl_3$.

20 Claims, 3 Drawing Sheets

METHOD OF MANUFACTURING A FERROELECTRIC DEVICE USING A PLASMA ETCHING PROCESS

The Government has rights in this invention pursuant to Contract No. N00030-93-C-0002, awarded by the Department of the Navy.

BACKGROUND OF THE INVENTION

This invention relates generally to processing of dielectric and, in particular, ferroelectric materials and more particularly to processing of such materials that have useful properties in semiconductor applications.

As it is known in the art, in modern digital computers one of the most commonly used circuits are semiconductor memory circuits. Semiconductor memory circuits generally include several types, random access memory types (RAM), electrically alterable read only memories (EAROM), electrically programmable read only memories (EPROM), and read only memories (ROM). In general, such semiconductor memories are fabricated with transistors, diodes, capacitors, and the like to provide memory elements and associated control circuitry as required. Generally the latter two types EPROM and (ROM) are designed to be programmed only once, the programmable read only memories (PROMs) proms being programmed by electrical means such as breaking electrical paths, whereas the ROMs being programmed during the fabrication process of the device. The first type (i.e. the random access memory) which may be a static or dynamic memory type is designed to be programmed and reprogrammed an indefinite number of times generally on the order of $10^{11}$ times. The RAM is generally used as the basic high speed memory in digital computers. RAMs are characterized as having read cycle times (i.e. data retrieval) and write cycle times (i.e. data storage) of about the same duration.

One problem with these memories is, however, the memories are generally volatile. That is, during loss of power the memory are generally lost. In many applications, sudden loss of information in these memories is undesirable.

There are several approaches which have been used to overcome these problems. Magnetic core memories and more recently plated wire memories are used to insure non-volatility. The plated wire or magnetic core memory approach is undesirable since they are each relatively large and of low density of data storage compared to semiconductor memories. They are also very expensive to build, are heavy, and require the need for several high power, power supplies. Another approach has been to provide battery backup to the random access memories. The problem with the battery backup is that it is generally cumbersome and adds increased cost to the circuit.

The EAROM is likewise not a suitable solution since it is not a random access memory. The electrically alterable read only memory is not random access because the write cycle time for such a device is generally an order of magnitude or more greater than the read cycle time making this device unsuitable for random access memory applications.

One approach which is currently being developed to provide a non-volatile random access memory is based on the use of ferroelectric materials. Ferroelectric materials such as perovskite materials of the form $ABO_3$ have many useful properties which can be exploited to provide a variety of electronic and opto-electronic devices such as the aforementioned non-volatile memories, as well as optical switches, optical modulators, pyroelectric detectors, integrated circuit artificial intelligence neural networks, and a variety of micromechanical devices.

Returning to the aforementioned non-volatile memory applications, in these applications ferroelectric films are provided over a semiconductor substrate including generally a large number of transistors.

In one type of memory element, the perovskite material film is disposed between a pair of conductors and is used as a polarizable dielectric for a capacitor. Depending upon the direction in which the voltage is applied to the capacitor, the direction of polarization of the ferroelectric dielectric in the capacitor will vary. This variation in polarization, therefore, can be exploited in a memory to provide a logic one or a logic zero (i.e. digital data bit) stored in the particular location of the memory. Since a principal driving force in all semiconductor memory applications is to increase the density of bits (or i.e. memory cells which can be located in a given area of semiconductor memory), it is generally desirable to have the capacitors formed adjacent to and over the transistors used to address individual memory elements of the semiconductor memory.

One ferroelectric material which is useful in the above-mentioned applications is the material known as lead zirconate titanate having the general chemical formula as $(Pb_xZr_yTi_{1-y}O_3)$ which will hereinafter be referred to as PZT. PZT is a multicomponent material (i.e. a ternary alloy of lead oxide, zirconium oxide, and titanium oxide). Several deposition techniques can be used to provide PZT films. One such technique is a solution gelation technique (sol-gel). One type of sol-gel process is described in a paper entitled "Sol-Gel Processing of $PbTiO_3$, $PbZrO_3$, PZT, and PLZT Thin Films" by Budd, et al., Proceedings of the British Ceramic Society, Vol. 36 (1985), pages 107–121.

A second sol-gel technique known in the art is described in a paper entitled "Preparation of $Pb(Zr,Ti)O_3$ Thin Films by Sol Gel Processing: Electrical, Optical, and Electro-optic Properties" by Yi, et al., Journal of Applied Physics, Vol. 64, No. 5 (September 1988), pages 2717–2724.

It is also known that, in order to exploit thin film PZT for integrated circuit applications, it is necessary to selectively pattern the PZT using manufacturable lithographic processes. Several other techniques for patterning PZT are available, such as wet chemical etching with HF solutions and ion milling, but each has serious drawbacks. Undercut of the photoresist masking pattern with wet chemical etches makes them unsuitable for state of the art, high packing density microcircuits. In addition, when the PZT crystallizes into mixed pyrochlore and perovskite phases, it becomes extremely difficult to pattern the PZT without severely undercutting photoresist masks because the etch rates of the two phases in common wet etchants may be dissimilar. Ion milling (or sputter etching) suffers from a lack of selectivity to underlying layers and excessive substrate heating (which can degrade PZT electrical properties) associated with attempting to achieve high etch rates required for efficient ion milling in a manufacturing environment.

SUMMARY OF THE INVENTION

In accordance with the present invention, a method of patterning a film of PZT material comprises the steps of: providing a mask over a selected surface portion the PZT material; and, plasma etching unmasked portions of the thin film material. The method includes the steps of: introducing a gas mixture of halogenated gases into a chamber; ionizing the gas mixture into a plasma in the chamber by imposition of an electric field across the introduced gaseous mixture; chemically reacting the ionized gaseous mixture; and chemically reacting the unmasked portions of the PZT material to selectively remove such exposed portions of the PZT material.

In a preferred embodiment, the gas mixture is a mixture of a chloride (i.e., a compound of chlorine) and a halocarbon or compound of fluorine. Preferably the halocarbon is a fluorocarbon. In particular, the fluorocarbon is trifluoromethane, $CHF_3$, and the chloride is boron trichloride $BCl_3$. In a preferred embodiment, the invention includes the step of forming the mask with sloped sidewalls.

In accordance with another feature of the invention, a method for providing a perovskite film having the general chemical formula $ABO_3$ over a substrate comprises the steps of providing in a solution A as an organic salt and B as an alkoxide and depositing from said solution a thin film of the material over a substrate. The process further comprises the step of heating said thin film of the material to sinter such thin film material and convert said thin film into a material having a perovskite crystalline phase. A mask is provided over a selected surface portion of the converted film material. Plasma etching of the masked structure is used to remove unmasked portions of the converted thin film material. Plasma etching herein refers to the process where a plasma ionizes a gas or gaseous mixture and the ionized gas or gaseous mixture chemically reacts with the surface being etched. The definition encompasses a number of procedures conventionally referred to as, reactive ion etching, sputter etching, etc.

In a preferred embodiment, a lead zirconate titanate material with a portion of a surface thereof masked, is placed in a plasma etching chamber. A gas mixture of halogenated gases, preferably a mixture of a chloride and a halocarbon or compound of fluorine. Preferably the halocarbon is a fluorocarbon. In particular, the fluorocarbon is trifluoromethane, $CHF_3$, and the chloride is boron trichloride $BCl_3$. The gas mixture comprising boron trichloride and trifluoromethane is ionized in the chamber by a plasma resulting from the imposition of an electric field across the introduced gaseous mixture as the gas mixture passes between two electrodes. The ionized gaseous mixture chemically reacts with the exposed portions of the lead zirconate titanate material to chemically react with, and selectively remove, such exposed portion of the material.

The process enables selectively removing, or selectively patterning, PZT ferroelectric material using a dry, chemical ion reactive plasma that etches the PZT without damaging underlying layers and masking materials. The process according to the invention, provides a very high degree of precision in transferring a mask pattern to the PZT layer. Therefore, the process is suitable for state of the art integrated circuit fabrication; provides comparable, highly repetitive etch rates for both pyrochlore and perovskite phases of PZT material; provides a high degree of etch rate selectivity to underlying layers used to provide a bottom electrode for a capacitive ferroelectric memory cell using the etched PZT layer as the ferroelectric dielectric for such memory cell; and, provides adequate etch rate selectivity to masking layers.

Another benefit of this invention is its ability to pattern PZT films containing mixed phases. In particular, when the bottom electrode is ruthenium or ruthenium oxide, it is common to observe that the crystallized PZT film is a mixture of perovskite and pyrochlore phases. The two phases etch at considerably different rates when using wet chemistry. The result is that the PZT material can be completely removed only with additional harsh wet chemical steps which lead to severe undercutting of the photoresist mask. However, with the process according to the invention, both phases of crystalline structure etch at relatively the same rate, with the result that the process according to the invention leaves no residual PZT on the bottom electrode.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Referring now to FIG. 1A–1E, steps in the fabrication of a ferroelectric device, in particular, a ferroelectric capacitor disposed between a pair of active regions such as transistors, for example, in a silicon substrate, here 0.5 millimeters thick, will be described.

Figure 1A:
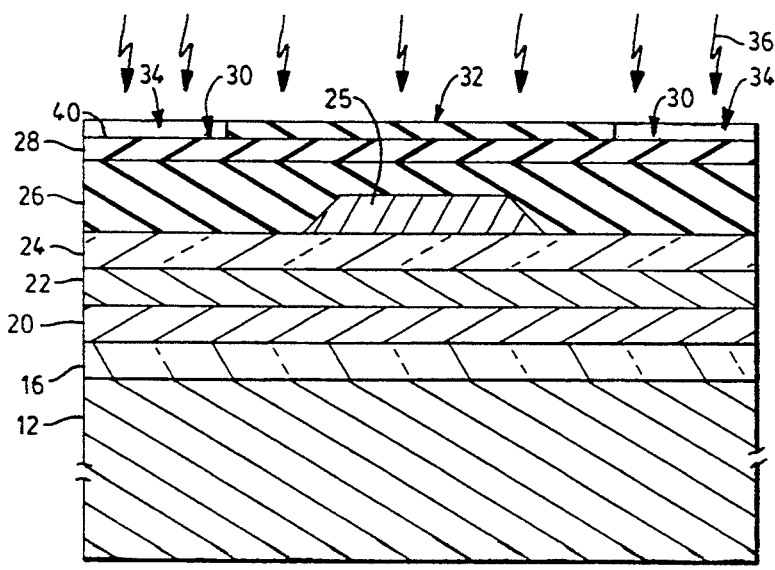
FIGS. 1A–1E are a series of diagrammatical, cross-sectional views, somewhat simplified and distorted, showing steps in fabricating a ferroelectric memory cell capacitor with a lead zirconate titanate film etched in accordance with the present invention; and, FIG. 2 is a schematic diagram of a plasma ion reactive etching chamber used in the process of forming the memory cell in FIGS. 1A–1E.

Referring first to FIG. 1A, a semiconductor substrate 12, here comprised of silicon or alternatively using any other known semiconductor material, is here processed to the point where transistors or other like devices have been provided therein. Disposed over substrate 12 is a layer 16 of here an oxide, preferably an in situ formed oxide of the material of the underlying semiconductor layer 12. Thus, here the layer 16 is comprised of silicon oxide. Here the silicon dioxide layer 16 is 3000 Angstroms thick. Disposed over the oxide layer 16 are sequentially deposited layers, here a titanium layer 20 and a layer 22 of platinum, to form the bottom electrode of the ferroelectric capacitor memory cell. The titanium layer 20 is sputtered or evaporated, here to a thickness of 500 to 1000 Angstroms. The platinum layer 22 is sputtered or evaporated to a thickness of 1000 Angstroms. Alternatively, layer 22 may be ruthenium or ruthenium oxide deposited by ion beam sputtering to a thickness of 1000–2000 Angstroms. Next a layer 24 of PZT (i.e. lead zirconate titanate or other perovskite material) is provided, here using sol-gel processing. The layer 24 provides a dielectric for a capacitor to be formed on the substrate 12. PZT layer 24 is here spin deposited on layer 22 to a thickness of 1700 Angstroms. Thicknesses of between 500 and 5000 Angstroms may also be used. The spun sol gel PZT thin film layer 24 is first baked at 300 degrees Centigrade in air for 1 minute.

After such baking, the PZT material is sintered and annealed by heating at 500 to 750 degrees Centigrade to convert the PZT material to perovskite phase. Here the PZT is annealed at 650 degrees Centigrade for 10 minutes in a pure oxygen ambient. It is noted that while perovskite phase results from the sintering process when the PZT layer 24 is disposed on a layer 22 of platinum, the PZT is converted into a mixture of pyrochlore phase and perovskite phase when the PZT layer 24 is deposited on a layer 22 of ruthenium or ruthenium oxide.

Next the top electrode of the ferroelectric capacitor memory cell is formed by first deposing a layer 25 of platinum over the converted PZT layer 24. Alternatively, the layer 25 may be ruthenium or ruthenium oxide as layer 22. A conventional positive photoresist masking layer (not shown) is spin deposited over layer 25. A mask (not shown) is projected onto the region of layer 25 where the top electrode of the capacitor is to be formed. The exposed portions of the photoresist are washed away. The layer 25 is patterned, as shown in FIG. 1A, by argon sputter etching, or argon ion milling, away the exposed portions of layer 25. The photoresist is removed in a conventional manner with an oxygen plasma and with a wet photoresist stripper, such as Baker PRS 2000. Next, a masking layer 26, here polydimethyl glutarmide (PMGI) material (manufactured by Shipley as SAL 110-PL1) is spun onto the surface of the PZT layer 24, here to a thickness of 3 micrometers. Thicknesses of 1 to 4 micrometers may also be used. The masking layer is deposited in two steps: First, the PMGI material is spun, here at a rate of 1600 rpm for 10 seconds to provide a layer with a thickness of 1.6 micrometers. It is next baked in air at 175 degrees Centigrade for 5 minutes to solidify. Next, a second 1.6 thick layer is spun, here at a rate of 1600 rpm for 10 seconds to provide a layer with a thickness of 1.6 micrometers onto the baked layer, and then it is also baked in air at 175 degrees Centigrade for 5 minutes.

Next, a conventional positive photoresist layer 28, here Shipley 1400-37 SVC is Spun onto the masking layer 26, here at a rate of 3000 RPM for 30 seconds to provide a thickness of 3.2 micrometers, and then baked in air at 110 degrees Centigrade for 40 seconds. A mask, or film, 30 is placed on, or projected onto, layer 28 over the region where the capacitor, and more particularly, where the PZT material for the capacitor, is to be formed. The mask 30 has an opaque portion 32 with surrounding transparent portions 34. The mask 30, and hence the portions of the photoresist layer 28 exposed by transparent portions 34, are exposed to ultraviolet light 36 for a period of time sufficient to provide an exposure energy of 325 milli-Joules per $cm^2$. The exposed portions 40 of the photoresist layer 28 are developed and removed with a developing solution, here Shipley Micoroposit MF-314, to produce the structure shown in FIG. 1B.

Figure 1B:
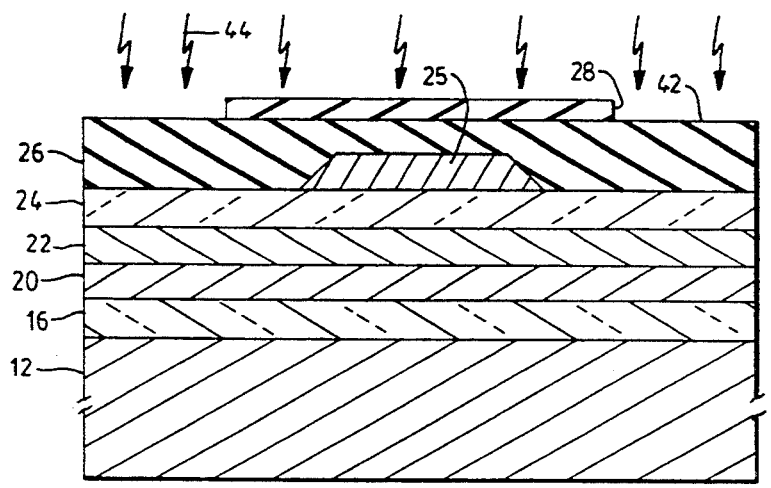

Referring to FIG. 1B, the structure shows that portions 42 of the PMGI masking layer 26 are now exposed by the removal of portions 40 of the photoresist layer 28. The surface of the structure is now exposed to deep ultraviolet light 44 (i.e. ultraviolet light having a wavelength of 300 nanometers). The surface is then developed, here using an AZ developer, to remove the opaque portions 34 of the photoresist layer 28 and exposed portions 42 of the PMGI masking layer 26. The structure is then hard baked at 225 degrees Centigrade for 4 minutes on a hot plate to produce the structure shown in FIG. 1C.

Figure 1C:
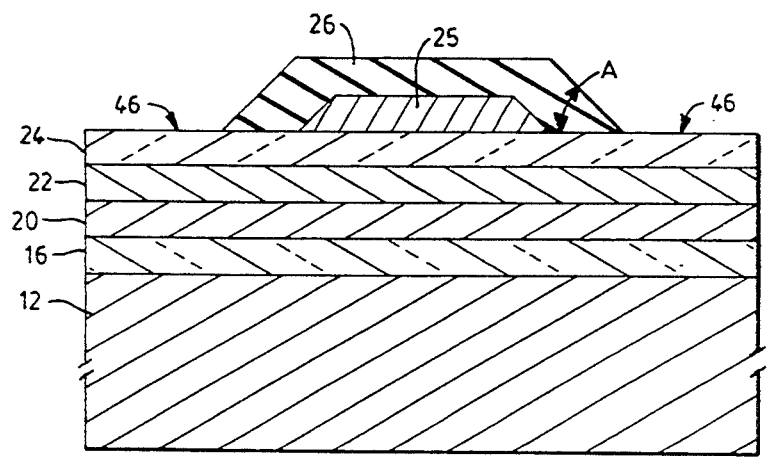

Referring to FIG. 1C, it is noted that the sidewalls of the PMGI masking later 26 are sloped at an acute angle A, here 55 degrees, with respect to the plane of the surface of the structure. The structure is next placed in a so-called barrel chamber etcher, here Branson/IPC, 3000 Series, Model Reactor Center Chamber PM 181 having a Model Generator number PM 119 which uses an oxygen plasma to remove any thin PMGI material which may be left on the exposed surface portions 46 of the PZT layer 24.

Figure 2:
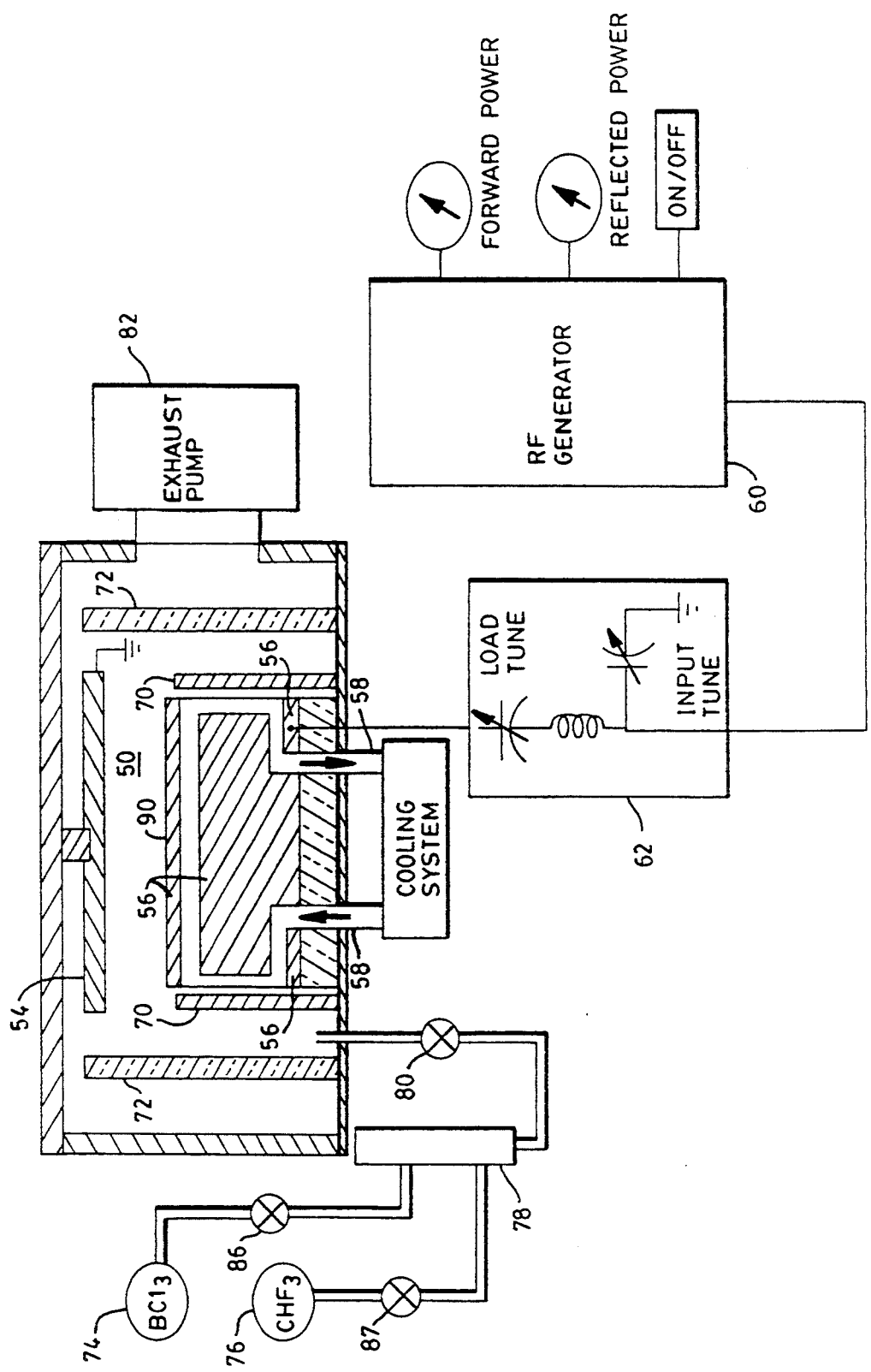

The structure is next placed in a plasma dry chemical reactive ion (RIE) etch chamber 50, here Materials Research RIE-61. Such chamber 50, shown in FIG. 2 is a so-called diode reactive ion etch chamber 50, here having a 20 inch diameter, a 16 inch diameter anode 54, and a 12 inch cathode 56. The cathode 56 is water cooled by a coiled tube 58 disposed in the bottom of the cathode 56. A radio frequency RF energy source 60, here a 13.56 MHZ power supply, is coupled to the cathode 56 through an impedance matching network 62 in a conventional manner, as shown. The impedance matching network 62 is of any conventional design to aid in adjusting forward (i.e. into the chamber 50) and reflected power (back to the RF source 60). A grounded, stainless steel, dark space shielding cylinder 70 is disposed around the outer periphery of the cathode 56, as shown. A Pyrex material cylinder 72 is disposed around the outer periphery of the stainless steel cylinder, as shown. Gases from sources 74, 76 are mixed in a manifold 78, the resulting gas mixture being introduced into chamber 50 via inlet 80 and exhausted from the chamber via exhaust pump 82. The gas introduced into chamber 50 is a mixture of halogenated gases, preferably a mixture of a chloride and a compound of fluorine. Preferably the compound of fluorine is a halocarbon or fluorocarbon, in particular, trifluoromethane, $CHF_3$, and the chloride is boron trichloride $BCl_3$. Here the gas stored in supply 74 is boron trichloride ($BCl_3$) and the gas stored in supply 76 is trifluoromethane ($CHF_3$).

The structure shown in FIG. 1C is placed in chamber 50. The chamber 50 is evacuated via exhaust pump 82 to a vacuum, here $10 \times ^{-5}$ Torr. Control valve 86 is adjusted to regulate the flow of the $BCl_3$ from supply 74 into chamber 50, here at a flow rate of 21.60 sccm (standard cubic centimeters per minute) and the control valve 87 is adjusted to regulate the flow rate of $CHF_3$ from supply 76 into chamber 50, here at a rate of 11.1 sccm (standard cubic centimeters per minute). The $BCl_3$ and $CHF_3$ gases enter chamber 50 via the mixing manifold 78, then pass between the anode 54 and upper surface 90 of the cathode 56, and are then removed from the chamber 50 via exhaust pump 82. The pressure in the chamber 50 is initially at, here 40 milli-Torr with the RF power from source 60 coupled into the chamber 50 to initiate a plasma region above the upper surface 90 of the cathode 56. The position of the stainless steel cylinder 70 is selected to produce a reactive area in the plasma glow region above the upper surface 90 of the cathode 56 a predetermined distance, here 0.5 centimeters. That is, a so-called dark space, here 0.5 centimeters is between the upper surface 90 of the cathode 56 and the bottom of the plasma glow region. After the plasma glow region is produced, the pressure in the chamber is reduced to, here 3 milli-Torr and the RF power supplied to the chamber is adjusted to minimize reflected power in a conventional manner via the impedance matching network 62 to a power density of here 1.77 watts per square inch. The inlet temperature of the water entering the chamber 50 is here 55 degrees Fahrenheit and the temperature of the water exiting the chamber 50 is here 60 degrees Fahrenheit.

The gas mixture of boron trichloride and trifluoromethane is therefore ionized in the chamber 50 by a plasma resulting from the imposition of an electric field across the introduced gaseous mixture as the gas mixture passes between the cathode 56 and grounded anode 54. The ionized gaseous mixture chemically reacts with the exposed portions 46 (FIG. 1C) of the lead zirconate titanate PZT layer 24 exposed by the PMGI masking layer 26, as well as exposed side and top surface portions of the PMGI masking layer 26 itself, to chemically react with, and selectively remove, such exposed portions of the materials. The etch of the exposed PZT material is anisotropic. The etch rate of the PZT material is between 97 and 125 Angstroms per minute. The etch rate of the PMGI material is about 161 Angstroms per minute. These etch rates are highly repeatable. Further, since the PZT layer 24 is disposed on a platinum, ruthenium, or ruthenium oxide layer 22, the latter layer 22 having a substantially slower etch rate then that of the PZT or PMGI layers, makes the process highly selective. (However, as will be discussed in more detail in connection with FIG. 1D, it should be noted that there is erosion of the PMGI material during the reactive ion etching process resulting in a build-up of reactants 100 (FIG. 1D) on the PMGI material sidewalls tapered edge. The reactants 100 are successfully removed during the resist strip step to be discussed in connection with FIG. 1D). Here, the thickness of the PZT layer 24 is here about 1700 Angstroms so that the etch time is typically between 20 to 25 minutes, accounting for an approximate 30% over etch.

The advantages, of the dry chemical etch as opposed to sputtering or wet etching are: a considerable improved etch rate; the exposure to adverse temperatures has been reduced; the selectivity to masking material (i.e., the PMGI material etch rate is 161 Angstroms per minute, and the PZT layer material etch rate is approximately 125 Angstroms per minute) is identifiable; and, perhaps most importantly, is the anisotropic nature of the dry etch which allows for patterning with substantially no undercutting of the masking material. The etch rate as opposed to the sputter rate increase from 11 Angstroms per minute to 125 Angstroms per minute. The 125 Angstroms per minute is the etch rate for non-annealed PZT. Annealed PZT etches slower at 97 Angstroms per minute. The overall etch time of the annealed and non-annealed PZT sample are similar because annealed PZT densifies and becomes thinner. For example, 2700 Angstrom thick layer of non-annealed PZT material would affectively etch in 21.6 mins. When annealed 2700 Angstrom thick PZT material densifies down to 1700 Angstroms, it would etch in 17.6 mins. Therefore, the amount of time a sample is exposed to the etch for an annealed sample would be less than for a non-annealed.

Figure 1D:
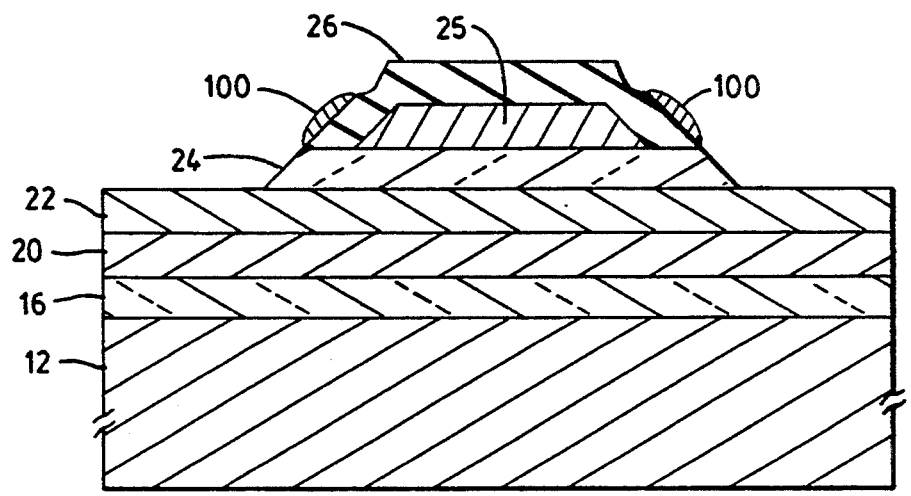

The resulting structure, shown in FIG. 1D, is then removed from chamber 50. It is noted that PZT and solidified reactants 100, presumably sputtered PZT material, become deposited on the sloped sidewalls of the unetched, remaining PZT layer 24, and the lower sidewall portions of the PMGI masking layer 26. The resulting structure is then placed in a bath of NMP at a temperature of 90 degrees Centigrade for about 30 minutes to remove the remaining PMGI layer 26 and the reactants 100. It should be noted that by forming the PMGI masking layer 26 with vertical walls, rather than with the sloped walls, the reactants 100 would have formed as a vertical wall, ring, or fence like structure attached to the PZT material, and such ring like structure would remain even after the NMP stripping process. Furthermore, if the PZT material was not annealed prior to the ion reactive etching process, the PMGI masking layer 26 lifts from the PZT layer 24 at the peripheral edge boundaries between layers 24 and 26. During the RIE process the reactants 100 deposit in the lifted region between the PMGI masking layer 26 and the PZT layer 24. With the reactants 100 deposited, and hence trapped, in this lifted region, it is difficult to move the trapped reactants. Furthermore, the lifting of the PMGI masking layer reduces the fidelity of the mask pattern transfer to the PZT layer 24.

Figure 1E:
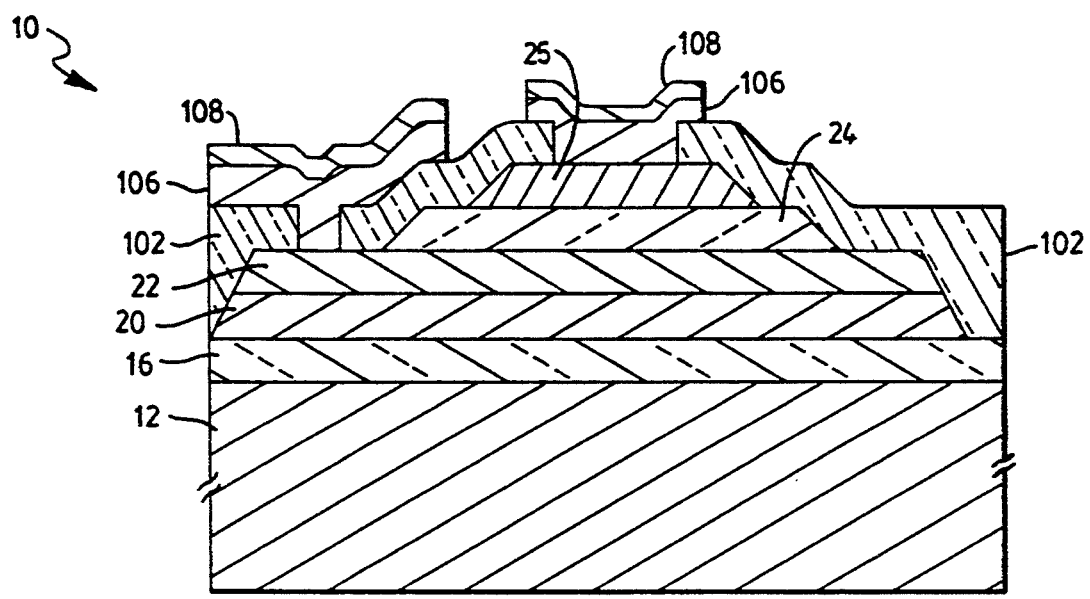

Referring now to FIG. 1E, the ferroelectric memory cell 10 is completed in a conventional manner. Thus, a photoresist layer (not shown) is formed into a mask for etching the bottom electrode layers 20, 22, as shown in FIG. 1E. The usual process is to use argon sputter etching or argon ion milling of the titanium layer 20 and platinum, ruthenium or ruthenium oxide layer 22. The photoresist layer (not shown) is removed in a conventional manner. Next, a dielectric layer 102, here of polyimide is deposited over the surface of the structure, as shown in FIG. 1E. The dielectric layer 102 is provided with apertures, not numbered, disposed over a portion of the upper surface of the top electrode layer 25 and a portion of bottom electrode layer 22, as shown. A layer 106 of a mixture of titanium and tungsten followed by a layer 108 of aluminum are formed over the exposed portions of layers 25 and 22 to form, in a conventional manner, the electrical interconnects between the upper and lower electrode of the ferroelectric capacitor and other circuit elements, not shown.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A method of patterning a film of PZT material comprising the steps of:

depositing an electrode over the film of PZT material;

providing a masking layer over a selected surface portion the PZT material and the electrode:

removing unwanted portions of the masking layer with the remaining portions of the masking layer; and plasma etching unmasked portions of the PZT material and the masking layer and removing any remaining portions of the masking layer and any resulting reactants formed about the remaining portions of the masking layer.

2. The method recited in claim 1 wherein the plasma etching step comprises the steps of:

introducing a gas mixture of halogenated gases into a chamber;

ionizing the gas mixture in the chamber into a plasma resulting from the imposition of an electric field across the introduced gas mixture; and chemically reacting the ionized gas mixture with the unmasked portions of the PZT material to selectively remove such exposed portion of the PZT material.

3. The method recited in claim 2 wherein the gas mixture is a mixture of a chloride and a compound of fluorine.

4. The method recited in claim 2 wherein the gas mixture is a mixture of a chloride and a halocarbon.

5. The method recited in claim 3 when the compound of fluorine is a fluorocarbon.

6. The method recited in claim 5 wherein the fluorocarbon is a trifluoromethane and the chloride is boron trichloride $BCl_3$.

7. A method of providing a ferroelectric device comprising the steps of:
 providing a substrate of semiconductor material with an active device disposed therein;
 disposing over the substrate a layer of oxide of the semiconductor material;
 disposing over the layer of oxide a bottom electrode of a ferroelectric capacitor memory cell;
 disposing over the bottom electrode a layer of perovskite material and baking the layer of perovskite material in air;
 sintering and annealing the layer of perovskite material to convert the perovskite material to a perovskite phase;
 depositing a top electrode over the layer of perovskite material comprising the steps of:
 depositing a first layer of material selected from one of the group of materials consisting of platinum, ruthenium and ruthenium oxide;
 depositing a photoresist masking layer and projecting a mask onto the first layer where the top electrode is to be formed;
 removing the photoresist masking layer and any unwanted material of the first layer;
 depositing a masking layer over remaining portions of the first layer including providing a first layer of polydimethyl glutarmide material and baking the first layer of polydimethyl glutarmide to solidify and providing a second layer of polydimethyl glutarmide material and baking the second layer of polydimethyl glutarmide to solidify;
 depositing a photoresist layer onto the masking layer and baking the photoresist layer in air;
 depositing a mask over the photoresist layer, the mask having an opaque portion over the electrode and surrounding transparent portions and exposing the mask to ultraviolet light;
 removing unwanted portions of the photoresist layer;
 exposing the structure to deep ultraviolet light and removing remaining portions of the photoresist layer and unwanted portions of the masking layer with remaining portions of the masking layer having sloped side walls;
 baking the structure on a hot plate;
 removing, using an oxygen plasma, any remaining undesired polydimethyl glutarmide material;
 exposing the structure to an ionized mixture of halogenated gases in a partial vacuum to remove exposed portions of the layer of perovskite material and exposed portions of the masking layer;
 placing the structure in a bath to remove any remaining portions of the masking layer and any resulting reactants formed about the remaining portions of the masking layer;
 removing unwanted portions of the bottom electrode;
 depositing a dielectric layer over the structure with an aperture over a portion of the bottom electrode and an aperture over a portion of the top electrode; and
 disposing an electrical interconnect in each aperture.

8. The method recited in claim 7 wherein the exposing the structure to an ionized mixture step comprises the steps of:
 introducing a gas mixture of halogenated gases into a chamber;
 ionizing said gas mixture in the chamber by a plasma resulting from the imposition of an electric field across the introduced gaseous mixture; and
 chemically the ionized gas mixture with the unmasked portions of the converted material to selectively remove such exposed portion of the converted material.

9. The method recited in claim 8, wherein the gas mixture is a mixture of a chloride and a compound of fluorine.

10. The method recited in claim 8 when the gas mixture is a mixture of a chloride and a halocarbon.

11. The method recited in claim 9 wherein the compound of fluorine is a fluorocarbon and the chloride is boron trichloride $BCl_3$.

12. The method recited in claim 11 wherein the fluorocarbon is trifluoromethane $CHF_3$.

13. A method of fabricating a ferroelectric device comprising the steps of:
 providing a substrate of semiconductor material with an active device disposed therein, said active device having an electrode connected thereto;
 disposing over the electrode a layer of perovskite material;
 depositing a Lop electrode over the layer of perovskite material comprising the steps of:
 depositing a first layer of material selected from one of the group of materials consisting of platinum, ruthenium and ruthenium oxide;
 depositing a photoresist masking layer and projecting a mask onto the first layer where the top electrode is to be formed;
 removing the photoresist masking layer and any unwanted material of the first layer;
 depositing a masking layer over remaining portions of the first layer;
 depositing a photoresist layer onto the masking layer and baking the photoresist layer in air;
 depositing a mask over the photoresist layer, the mask having an opaque portion over the electrode and surrounding transparent portions and exposing the mask to ultraviolet light;
 removing unwanted portions of the photoresist layer;
 exposing the structure to deep ultraviolet light and removing remaining portions of the photoresist layer and unwanted portions of the masking layer with remaining portions of the masking layer having sloped side walls;
 baking the structure on a hot plate;
 removing, using an oxygen plasma, any remaining undesired material;
 exposing the structure to an ionized mixture of halogenated gases in a partial vacuum to remove exposed portions of the layer of perovskite material and exposed portions of the masking layer; and
 placing the structure in a bath to remove any remaining portions of the masking layer and any resulting reactants formed about the remaining portions of the masking layer.

14. The method recited in claim 13 wherein the exposing the structure to an ionized mixture step comprises the steps of:

introducing a gas mixture of halogenated gases into a chamber;

ionizing the introduced gases mixture into the chamber by a plasma resulting from the imposition of an electric field across the introduced gaseous mixture; and chemically reacting the ionized gas mixture with the unmasked portions of the thin film material to selectively remove such exposed portion of the thin film material.

15. The method recited in claim 14 wherein the gas mixture is a mixture of a chloride and a compound of fluorine.

16. The method recited in claim 15 when the compound of fluorine is a fluorocarbon.

17. The method recited in claim 16 wherein the fluorocarbon is trifluoromethane $CHF_3$ and the chloride is boron trichloride $BCl_3$.

18. The method recited in claim 15 wherein the compound of fluorine is a halocarbon.

19. The method recited in claim 14 wherein the gas mixture includes a compound of chlorine.

20. The method recited in claim 19 wherein the compound of chlorine is boron trichloride $BCl_3$.

* * * * *